US012669554B2

(12) United States Patent (10) Patent No.: US 12,669,554 B2
Askeland et al. (45) Date of Patent: Jun. 30, 2026

(54) DIRECTIONAL OVERCURRENT MONITORING IN SUBSTATION TRANSFORMERS

(71) Applicant: OneSubsea IP UK Limited, London (GB)

(72) Inventors: Audun Magne Askeland, Sandsli (NO); Kristiansen Baricuatro, Sandsli (NO)

(73) Assignee: OneSubsea IP UK Limited, London (GB)

( * ) Notice: Subject to any disclaimer, the term of this patent is extended or adjusted under 35 U.S.C. 154(b) by 131 days.

(21) Appl. No.: 18/799,066

(22) Filed: Aug. 9, 2024

(65) Prior Publication Data

US 2025/0052836 A1 Feb. 13, 2025

Related U.S. Application Data

(60) Provisional application No. 63/518,491, filed on Aug. 9, 2023.

(51) Int. Cl.
*G01R 31/62* (2020.01)
*G01R 25/00* (2006.01)
*H02H 7/22* (2006.01)
(52) U.S. Cl.
CPC ........... *G01R 31/62* (2020.01); *G01R 25/005* (2013.01); *H02H 7/22* (2013.01)
(58) Field of Classification Search
CPC ........ G01R 31/62; G01R 25/005; H02H 7/22; H02H 7/226
See application file for complete search history.

(56) References Cited

U.S. PATENT DOCUMENTS

| 3,614,534 | A | * | 10/1971 | Gross | ................... | H02H 1/0015 |
| | | | | | | 361/45 |
| 3,815,006 | A | * | 6/1974 | Woods | ................ | H02J 13/1313 |
| | | | | | | 318/473 |
| 4,002,951 | A | * | 1/1977 | Halbeck | ............. | H01R 13/7135 |
| | | | | | | 361/45 |
| 5,818,181 | A | * | 10/1998 | Ballard | .............. | H05B 41/2851 |
| | | | | | | 315/276 |

(Continued)

FOREIGN PATENT DOCUMENTS

| AT | 523449 | A2 | * | 8/2021 | ............. | G01R 31/56 |
| CN | 115527757 | A | * | 12/2022 | ............. | H01F 27/34 |
| EP | 4647625 | A1 | * | 11/2025 | ............... | H02K 7/09 |

OTHER PUBLICATIONS

Search Report and Written Opinion of International Application No. PCT/US2024/041644 dated Nov. 20, 2024, 9 pages.

*Primary Examiner* — Dharti H Patel
(74) *Attorney, Agent, or Firm* — Kyle R. Miiller

(57) ABSTRACT

The present disclosure provides techniques and apparatus for fault monitoring for a substation transformer. An example substation includes a transformer coupled to a plurality of generators, and a monitoring circuit. The transformer includes a core and a monitoring winding disposed on the core. The monitoring circuit is coupled to the monitoring winding. The monitoring circuit is configured to measure a first single-phase voltage of the transformer via the first monitoring winding. The monitoring circuit is also configured to monitor for one or more faults that affect the substation based at least in part on the first single-phase voltage.

18 Claims, 12 Drawing Sheets

(56) References Cited

U.S. PATENT DOCUMENTS

| | | | | |
|---|---|---|---|---|
| 6,137,418 | A * | 10/2000 | Zuercher | H02H 3/083 |
| | | | | 318/650 |
| 6,479,976 | B1 * | 11/2002 | Edel | G01R 15/183 |
| | | | | 323/357 |
| 6,522,517 | B1 * | 2/2003 | Edel | G01R 15/185 |
| | | | | 361/146 |
| 6,538,863 | B1 * | 3/2003 | Macbeth | H02H 3/334 |
| | | | | 361/45 |
| 7,642,888 | B2 * | 1/2010 | Avila Montes | H01F 29/14 |
| | | | | 336/155 |
| 10,784,063 | B1 * | 9/2020 | Montich | H01H 33/666 |
| 11,946,966 | B1 * | 4/2024 | Chowdhury | G01R 31/346 |
| 12,155,219 | B2 * | 11/2024 | Cox | H02J 3/381 |
| 2009/0000654 | A1 | 1/2009 | Rotzoll et al. | |
| 2009/0267521 | A1 * | 10/2009 | Jin | H05B 41/2822 |
| | | | | 315/121 |
| 2010/0244575 | A1 | 9/2010 | Coccia et al. | |
| 2012/0049637 | A1 | 3/2012 | Teichmann et al. | |
| 2012/0327538 | A1 * | 12/2012 | Lim | H02H 9/023 |
| | | | | 361/19 |
| 2013/0009483 | A1 * | 1/2013 | Kawate | H02J 7/35 |
| | | | | 307/77 |
| 2015/0270699 | A1 * | 9/2015 | Tepper | H01F 27/402 |
| | | | | 361/35 |
| 2017/0263371 | A1 | 9/2017 | Roth et al. | |
| 2018/0294651 | A1 * | 10/2018 | Roberts | H02J 4/00 |
| 2020/0067445 | A1 * | 2/2020 | Chowdhury | H02P 29/0241 |
| 2021/0098985 | A1 * | 4/2021 | Kim | H02H 7/26 |
| 2021/0215772 | A1 * | 7/2021 | Mauney | G01R 19/16566 |
| 2022/0320852 | A1 * | 10/2022 | Maldonado | H02H 7/062 |
| 2023/0026470 | A1 * | 1/2023 | Soerensen | F03D 9/00 |
| 2023/0143859 | A1 * | 5/2023 | Nielsen | F03D 9/257 |
| | | | | 290/44 |
| 2023/0155371 | A1 * | 5/2023 | Mysore | H02H 3/40 |
| | | | | 363/95 |
| 2023/0361597 | A1 * | 11/2023 | Penttonen | H02J 50/10 |
| 2025/0110191 | A1 * | 4/2025 | Iwanusiw | G01R 31/62 |

* cited by examiner

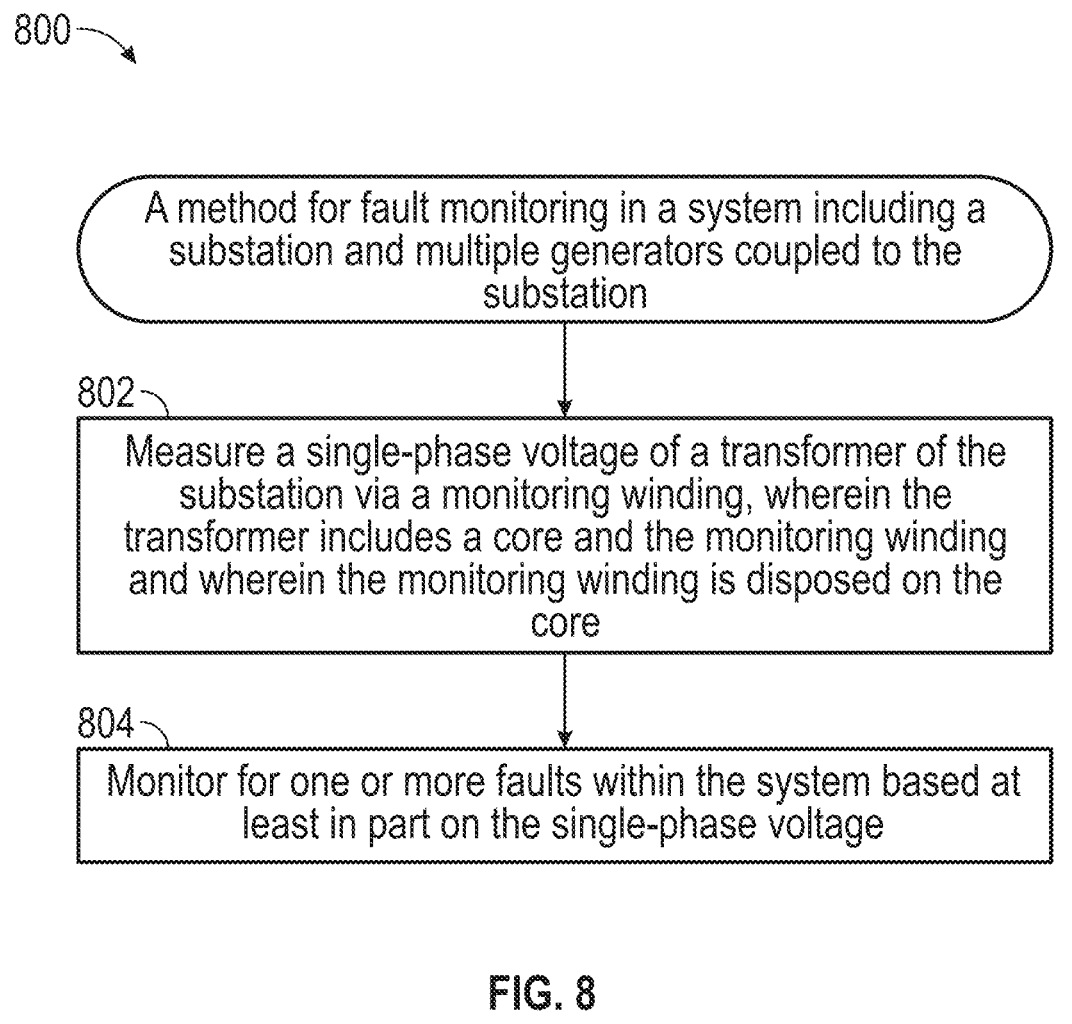

800

A method for fault monitoring in a system including a substation and multiple generators coupled to the substation

802

Measure a single-phase voltage of a transformer of the substation via a monitoring winding, wherein the transformer includes a core and the monitoring winding and wherein the monitoring winding is disposed on the core

804

Monitor for one or more faults within the system based at least in part on the single-phase voltage

FIG. 8

DIRECTIONAL OVERCURRENT MONITORING IN SUBSTATION TRANSFORMERS

CROSS-REFERENCE TO RELATED APPLICATION

This application claims the benefit of U.S. Provisional Patent Application Ser. No. 63/518,491, filed Aug. 9, 2023, which is expressly incorporated by reference herein in its entirety and for all applicable purposes.

BACKGROUND

Field of the Disclosure

The present disclosure relates to a fault monitoring system for an electrical substation, and, more particularly, to directional overcurrent monitoring in substation transformers.

Description of Related Art

Electrical substations are crucial components of power systems that facilitate the efficient transmission, distribution, and control of electricity for a variety of applications (e.g., residential, commercial, industrial, etc.). For example, electrical substations may serve several functions in power distribution systems such as voltage transformation (e.g., transforming voltage levels to facilitate efficient transmission and distribution of electricity), switching (e.g., isolating and switching of electrical circuits for maintenance, repairs and rerouting of power during outages or emergencies), distribution, protection, monitoring and control, power factor correction, and grid stability, among others.

Additionally, electrical substations may be deployed in a variety of environments (e.g., offshore environments, onshore environments) and may be used to interface with a variety of different energy sources, including traditional oil and gas energy sources as well as renewable energy sources (e.g., wind, solar, tidal, geothermal, etc.). For example, a subsea substation may be used to electrically power and support subsea applications, which may involve obtaining hydrocarbon fluids (e.g., oil and natural gas) from a subterranean geologic formation, referred to as a reservoir, by drilling a well through a subsea wellhead system that penetrates the hydrocarbon-bearing geologic formation.

SUMMARY

One embodiment of the present disclosure described herein is a substation. The substation generally includes a transformer and a monitoring circuit. The transformer is coupled to a plurality of generators. The transformer includes a core and a first monitoring winding disposed on the core. The monitoring circuit is coupled to the first monitoring winding. The monitoring circuit is configured to measure a first single-phase voltage of the transformer via the first monitoring winding. The monitoring circuit is also configured to monitor for one or more faults that affect the substation based at least in part on the first single-phase voltage.

Another embodiment of the present disclosure described herein is a system. The system includes a plurality of generators and a substation coupled to the plurality of generators. The substation includes a transformer and a monitoring circuit. The transformer includes a core and a first monitoring winding disposed on the core. The monitoring circuit is coupled to the first monitoring winding. The monitoring circuit is configured to measure a first single-phase voltage of the transformer via the first monitoring winding. The monitoring circuit is also configured to monitor for one or more faults within the system based at least in part on the first single-phase voltage.

Another embodiment of the present disclosure is a method for fault monitoring in a system comprising a substation and a plurality of generators coupled to the substation. The method includes measuring a single-phase voltage of a transformer of the substation via a monitoring winding, wherein the transformer comprises a core and the monitoring winding and wherein the monitoring winding is disposed on the core. The method also includes monitoring for one or more faults within the system based at least in part on the single-phase voltage.

The following description and the appended figures set forth certain features for purposes of illustration.

BRIEF DESCRIPTION OF DRAWINGS

Various embodiments in accordance with the present disclosure will be described with reference to the drawings, where like designations denote like elements. Note that the appended drawings illustrate typical embodiments and are therefore not to be considered limiting; other equally effective embodiments are contemplated.

FIG. 8 is a flow diagram depicting an example operations for performing fault monitoring, according to various embodiments.

DETAILED DESCRIPTION

Figure 1:
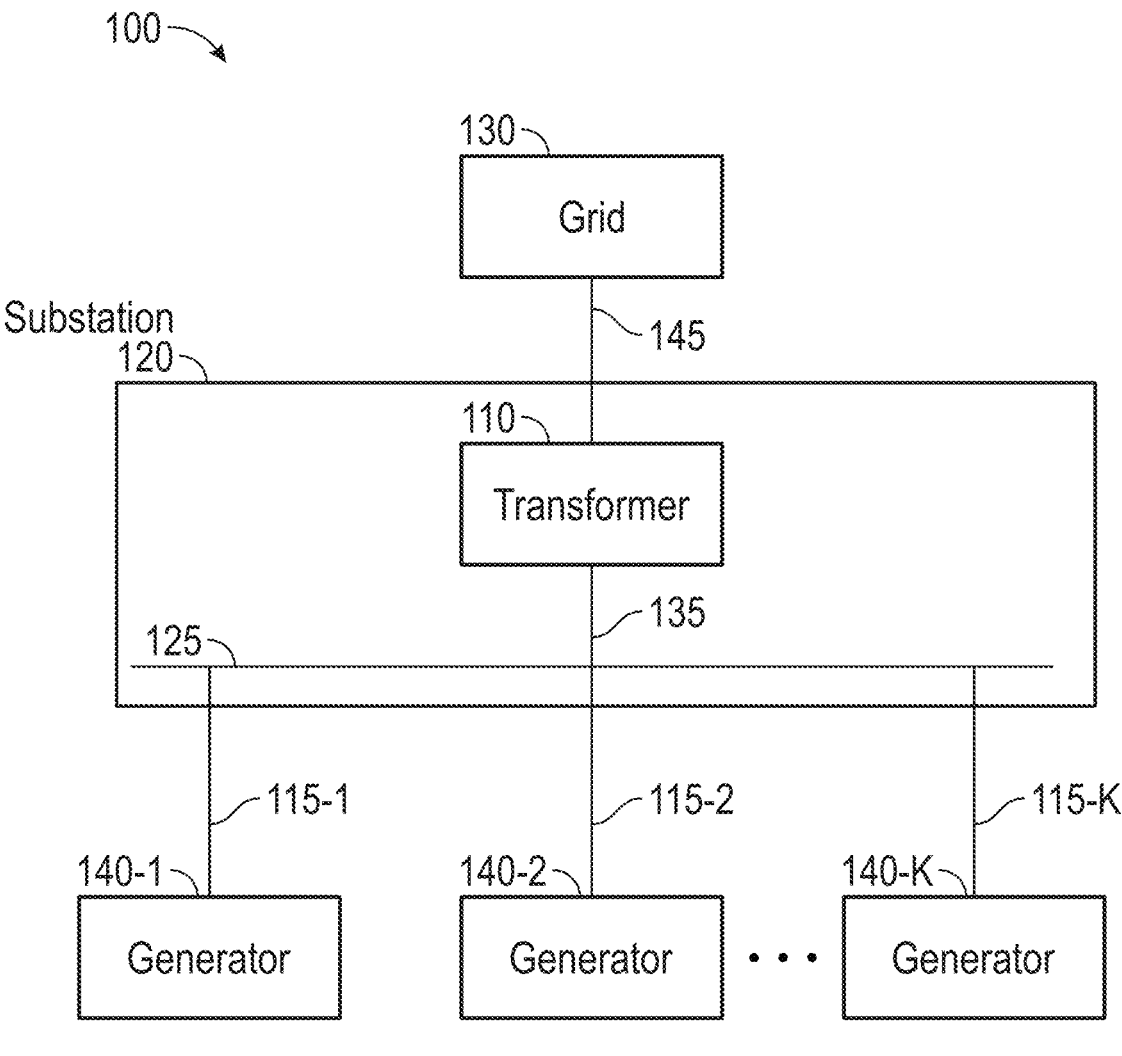
FIG. 1 is a schematic diagram of an example system, according to various embodiments.

Certain electrical systems may include a substation (e.g., subsea (offshore) substation, onshore substation) that is coupled to multiple generators. The generators may feed into a busbar system, and the busbar system may supply a voltage to the substation. The substation may include a transformer, which transforms the incoming voltage up to an export voltage for distribution to a grid. One challenge with such systems is that it can be significantly difficult or impractical to determine the location of an electrical fault that occurs in the system. For example, if an electrical short circuit (or ground fault) occurs in the system, then each generator and the grid may contribute to the fault current. As such, pinpointing the location of the fault current may not be achieved by measuring the currents alone. Accordingly, there exists a need for improved fault detection techniques in systems in which a substation transformer is coupled to multiple generators.

The disclosure provides techniques, methods, systems, apparatus, and computer readable media for performing fault monitoring for an electrical substation having a transformer coupled to multiple generators. For example, a substation system according to one or more embodiments described herein may include a transformer having a core and one or more monitoring windings disposed on the core, and a monitoring circuit coupled to the one or more monitoring windings. The monitoring circuit may perform fault monitoring using a voltage measurement(s) obtained via the monitoring windings and current measurement obtained via one or more current transformers.

For example, the monitoring circuit may use each monitoring winding to measure a respective single-phase voltage of the transformer. The monitoring circuit may also measure one or more single-phase currents of the transformer, e.g., using one or more current transformers. Using the voltage and current measurements, the monitoring circuit can determine which direction a fault current is flowing (e.g., power flow direction), and determine which generator (e.g., feeder/incomer) is a source of the electrical fault. For instance, using a combination of the voltage and current measurements, the monitoring circuit can determine the direction the fault current is flowing relative to a measurement point within the system, based on phase angles of the current and voltage.

The techniques, methods, systems, apparatus, and computer readable media for performing fault monitoring for an electrical substation having a transformer coupled to multiple generators may provide various advantages. For example, the monitoring winding(s) described herein may allow for performing a voltage measurement without employing voltage transformers. Such voltage transformers, for example, may introduce a risk of shorting out the main circuit because they are generally galvanically connected to the high voltage main circuit. Because the techniques herein involve determining the direction of the fault energy flow, via the monitoring windings, the techniques for fault monitoring do not have to rely on such high accuracy voltage transformers. Additionally, the monitoring winding(s) described herein may also be used to supply power to the monitoring circuit as well as perform voltage measurement, eliminating the need for an additional power supply circuit. Moreover, in certain cases, the techniques and systems herein may allow for the generator that is the source of the fault to be removed from the circuit, either automatically by the use of circuit breakers, or by means of off-load disconnection after the transformer has been de-energized.

The following description includes embodiments of the best mode presently contemplated for practicing the described implementations. This description is not to be taken in a limiting sense, but rather is made merely for the purpose of describing the general principles of the implementations. The scope of the described implementations should be ascertained with reference to the issued claims.

Although the terms "first," "second," "third," etc., may be used herein to describe various elements, components, regions, layers and/or sections, these elements, components, regions, layers and/or sections should not be limited by these terms. These terms may be only used to distinguish one element, component, region, layer or section from another element, component, region, layer, or section. Terms such as "first," "second," and other numerical terms, when used herein, do not imply a sequence or order unless clearly indicated by the context. Thus, a first element, component, region, layer, or section discussed herein could be termed a second element, component, region, layer, or section without departing from the teachings of the example embodiments.

As used herein, a hyphenated form of a reference numeral refers to a specific instance of an element and the un-hyphenated form of the reference numeral refers to the collective element. Thus, for example, device "12-1" refers to an instance of a device class, which may be referred to collectively as devices "12" and any one of which may be referred to generically as a device "12."

One or more specific embodiments of the present disclosure will be described below. The particulars shown herein are by way of example, and for purposes of illustrative discussion of the embodiments of the subject disclosure only and are presented in the cause of providing what is believed to be the most useful and readily understood description of the principles and conceptual aspects of the subject disclosure. In this regard, no attempt is made to show structural details of the subject disclosure in more detail than is necessary for the fundamental understanding of the subject disclosure, the description taken with the drawings making apparent to those skilled in the art how the several forms of the subject disclosure may be embodied in practice. Additionally, in an effort to provide a concise description of these exemplary embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time-consuming, but would nevertheless be a routine undertaking of design, fabrication, and manufacture for those of ordinary skill having the benefit of this disclosure.

Example System for Performing Fault Monitoring for a Substation Transformer

FIG. 1 is a schematic diagram of at least a portion of an example implementation of a system 100 that can be configured to perform fault monitoring for a substation transformer, according to various embodiments. As shown, the system 100 includes, without limitation, multiple generators 140-1 to 140-K, a substation 120, and a grid 130. The substation 120 is representative of a variety of substations, such as offshore substations (e.g., subsea substations) and on-shore substations, as illustrative examples. The substation 120 may perform a variety of functions to facilitate the transmission, distribution, and control of electricity from the generators 140. As an illustrative example, in some cases, the substation 120 uses a transformer 110 to reduce electrical losses from electrical power generation by increasing the voltage and then exporting the power to the grid 130.

The generators 140 may supply electrical power from a variety of different types of energy sources, such as oil and natural gas energy sources, nuclear power, tidal energy sources, wind energy, and solar energy, as illustrative, non-limiting examples. The generators 140 may be located on-shore or off-shore. Each generator 140-1 to 140-K may supply three-phase electrical power via a respective conductor 115-1 to 115-K (e.g., cable, copper bar, etc.) to a busbar system 125 within substation 120. The busbar system 125 may combine the electrical power from the generators 140 and provide three-phase electrical power to the transformer 110 within the substation 120 via a conductor 135 (e.g., cable, copper bar, etc.). In certain embodiments, the substation 120 may transform, via the transformer 110, the three-phase voltage supply from the busbar system 125 up to an export voltage for distribution to the grid 130 via conductor 145 (e.g., cable, copper bar, etc.).

Figure 2:
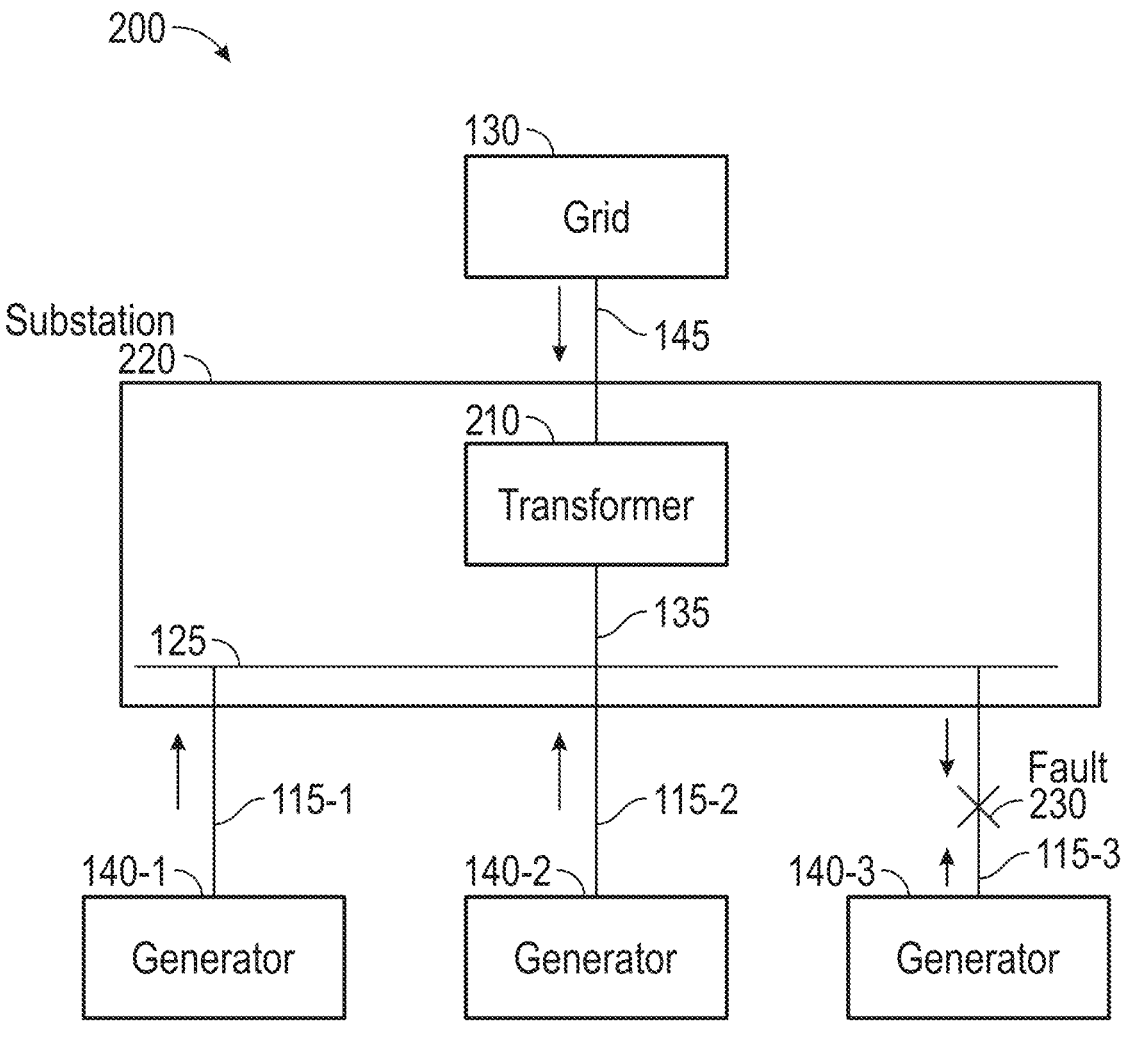
FIG. 2 depicts an example scenario of an electrical fault within an electrical system, according to various embodiments.

As noted, in electrical systems that include a transformer coupled to multiple generators (e.g., incomers/feeders), it may be significantly difficult to determine the location of electrical faults that occur in the system. By way of example, consider the scenario depicted in FIG. 2, which illustrates a system 200 including a substation 220, which includes a transformer 210 coupled to three generators 140-1 to 140-3 via a busbar system 125. In this scenario, when an electrical fault 230 occurs between the substation 220 and the generator 140-3, each generator 140-1 to 140-3 as well as the grid 130 may contribute to the fault current (e.g., as indicated by the direction of the arrows). Consequently, it may not be possible to determine the location of the electrical fault 230 by measuring currents within the system alone.

To address this, certain embodiments described herein provide improved techniques for monitoring electrical faults that occur in a system having a substation transformer coupled to multiple generators. For example, according to one or more embodiments described herein, the substation 120 depicted in FIG. 1 may include (i) a transformer having a core and one or more monitoring windings disposed on the core; and (ii) a monitoring circuit coupled to the one or more monitoring windings. The monitoring circuit may perform fault monitoring using a voltage measurement(s) obtained via the monitoring windings and current measurement obtained via one or more current transformers. By using the monitoring winding(s) to obtain the voltage measurement, the substation 120 can perform fault monitoring without relying on a voltage transformer that is galvanically connected to the main circuit, thereby avoiding the potential risk of such voltage transformers shorting out the main circuit.

Figure 3:
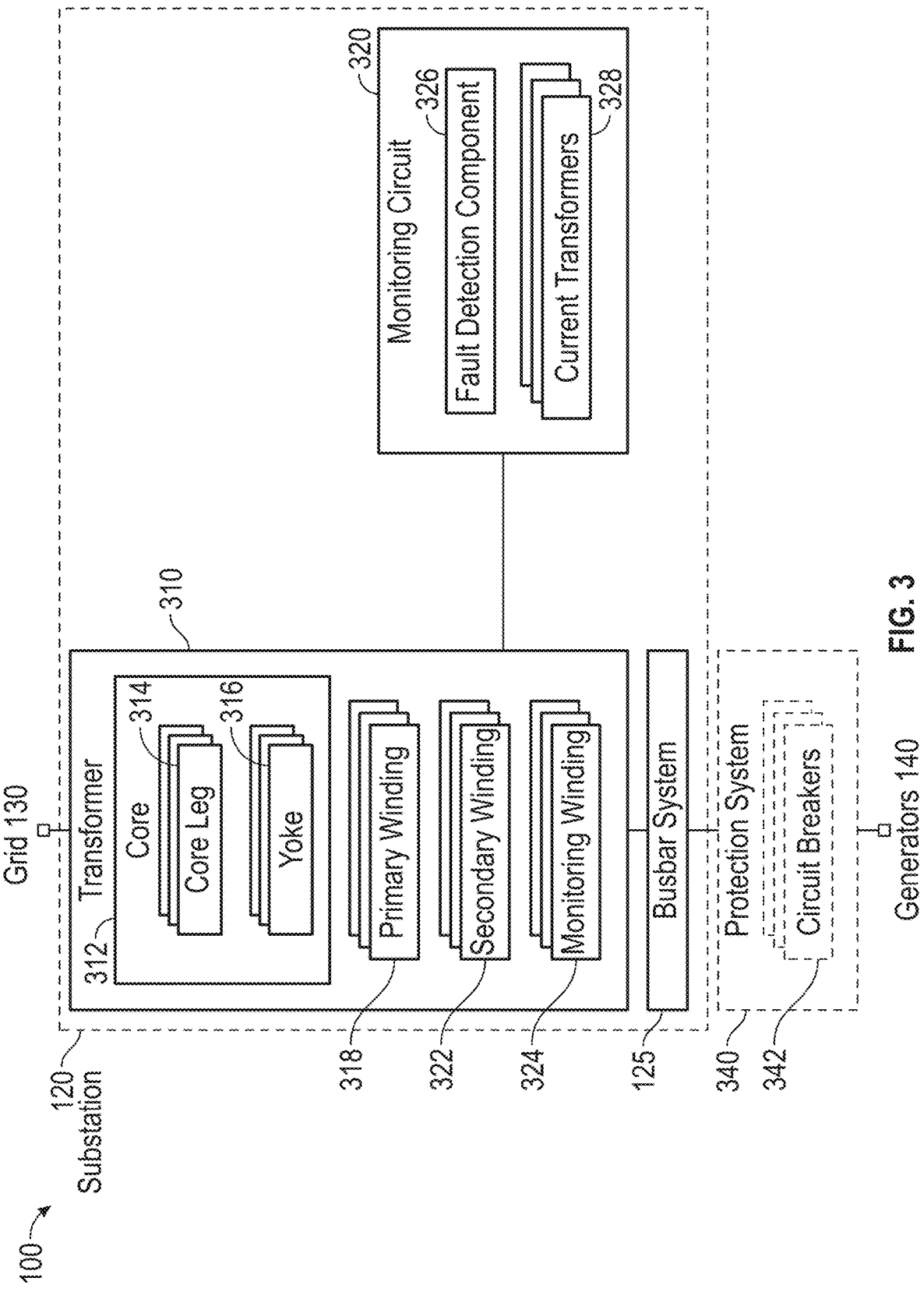
FIG. 3 further depicts the system illustrated in FIG. 1, according to various embodiments.

FIG. 3 is a block diagram further illustrating the system 100, described relative to FIG. 1, according to various embodiments. As shown, the substation 120 includes a transformer 310, a busbar system 125, and a monitoring circuit 320. The transformer 310 is an example implementation of the transformer 110 depicted in FIG. 1. The transformer 310 is coupled to multiple generators 140 via the busbar system 125. Note, while FIG. 3 depicts the busbar system 125 as separate from the transformer 310, in certain embodiments, the busbar system 125 may be integrated with the transformer 310.

In certain embodiments, the transformer 310 is a three-phase transformer. The transformer 310 includes a core 312 having one or more core legs 314 and one or more yokes 316. The core 312 is generally representative of different types of transformer cores, including core type and shell type, as illustrative examples. The core 312 is generally composed of multiple laminated sheets of ferrous metal (e.g., steel laminations).

The core 312 includes one or more core legs 314 and one or more yokes 316. The core legs 314 (also referred to as core limbs) are generally the vertical sections of the core 312. The yokes 316 are generally the horizontal sections of the core 312 that join the core legs 314 together. The core 312 may have different configurations with different numbers of core legs 314 and yokes 316. For example, the core 312 may be a 3-leg core (e.g., three core legs 314), a 4-leg core (e.g., four core legs 314), or a 5-leg core (e.g., five core legs 314), among other configurations.

The transformer 310 also includes a set of primary windings 318 and a set of secondary windings 322. The primary windings 318 may be high-voltage windings (e.g., coils) and the secondary windings 322 may be low-voltage windings (e.g., coils). A three-phase transformer generally includes three sets of windings, each set including a respective primary winding 318 and secondary winding 322. Each set of windings may be disposed on a different core leg 314 of the core 312. In some configurations, the primary winding 318 and secondary winding 322 within a given set may be arranged concentrically around the respective core leg 314, with the primary winding 318 (e.g., high voltage winding) being wound over the secondary winding 322 (e.g., low voltage winding). In other configurations, the primary winding 318 and secondary winding 322 may be arranged concentrically around the respective core leg 314, with the secondary winding 322 arranged on a lower portion of the core leg 314 than the primary winding 318. Note, however, that these are merely examples and that other configurations of primary/secondary windings are contemplated.

For each respective set of windings, the primary winding 318 is generally coupled to a different (single-phase) power supply of a three-phase power supply. When an alternating current (AC) flows through the primary winding 318, the primary winding 318 may generate a changing electromagnetic field. This changing electromagnetic field may induce a voltage in the secondary winding 322, which is inductively coupled to the primary winding 318. The primary windings 318 of the transformer 310 may be connected together in various configurations, such as a delta (mesh) configuration or a star (wye) configuration, as illustrative examples. Similarly, the secondary windings 322 of the transformer 310 may be connected together in various configurations, such as delta (mesh) configuration or star (wye) configuration, as illustrative examples. Assuming a symmetric three-phase supply, the single-phase currents of the transformer 310 may be out-of-phase with respect to each other by 120 degrees (°), and the single-phase voltages of the transformer 310 may be out-of-phase with respect to each other by 120°.

In certain embodiments, the transformer 310 may include one or more monitoring windings 324. As described in various embodiments below, the transformer 310 may include any number of monitoring windings 324, and the monitoring winding(s) 324 may be disposed in various locations of the core 312. For example, in certain embodiments, the transformer 310 may include a single monitoring winding 324 disposed on the core 312, e.g., around a core leg 314, around a yoke 316, or a combination thereof. In certain embodiments, the transformer 310 may include multiple monitoring windings disposed on the core 312, e.g., around one or more core legs 314, around one or more yokes 316, or a combination thereof.

Each monitoring winding 324 may be used to measure a respective single-phase voltage of the transformer 310. For example, each monitoring winding 324 may be disposed on the core 312, such that it is inductively coupled to a respective primary winding 318 on the core 312 and the magnetic field generated from the primary winding 318 induces a single-phase voltage in the monitoring winding 324.

In certain embodiments, the monitoring circuit 320 is coupled to each monitoring winding 324. In certain embodiments, the monitoring winding 324 may be used to power the monitoring circuit 320. For example, the monitoring winding 324 may supply a single-phase power to the monitoring circuit 320.

As shown, the monitoring circuit 320 includes a fault detection component 326 and one or more current transformers 328. Each current transformer 328 may be coupled to the transformer 310 and/or to the generator(s) 140, and may be configured to measure a respective single-phase current within the transformer 310.

The fault detection component 326 is generally configured to perform fault monitoring based on one or more voltage measurements obtained via the monitoring winding(s) 324 and one or more current measurements obtained via the current transformer(s) 328. In certain embodiments, the fault detection component 326 performs directional overcurrent monitoring using a combination of the voltage and current measurements. For example, as part of the directional overcurrent monitoring, the fault detection component 326 may use a combination of the current and voltage measurements to determine a direction of a fault relative to the measurement point, based on phase angles of the voltage and current.

In certain embodiments, the system 100 includes a protection system 340, which is coupled between the substation 120 and the generators 140. The protection system 340 includes one or more circuit breaker 342 that are configured to disconnect a source of the fault from the substation 120. In certain embodiments, when the fault detection component 326 determines the location of the fault (e.g., which generator 140 is the source of the fault), the fault detection component 326 may trigger the respective circuit breaker 342 associated with the branch of the fault location to automatically disconnect the branch from the main circuit.

Figure 4A:
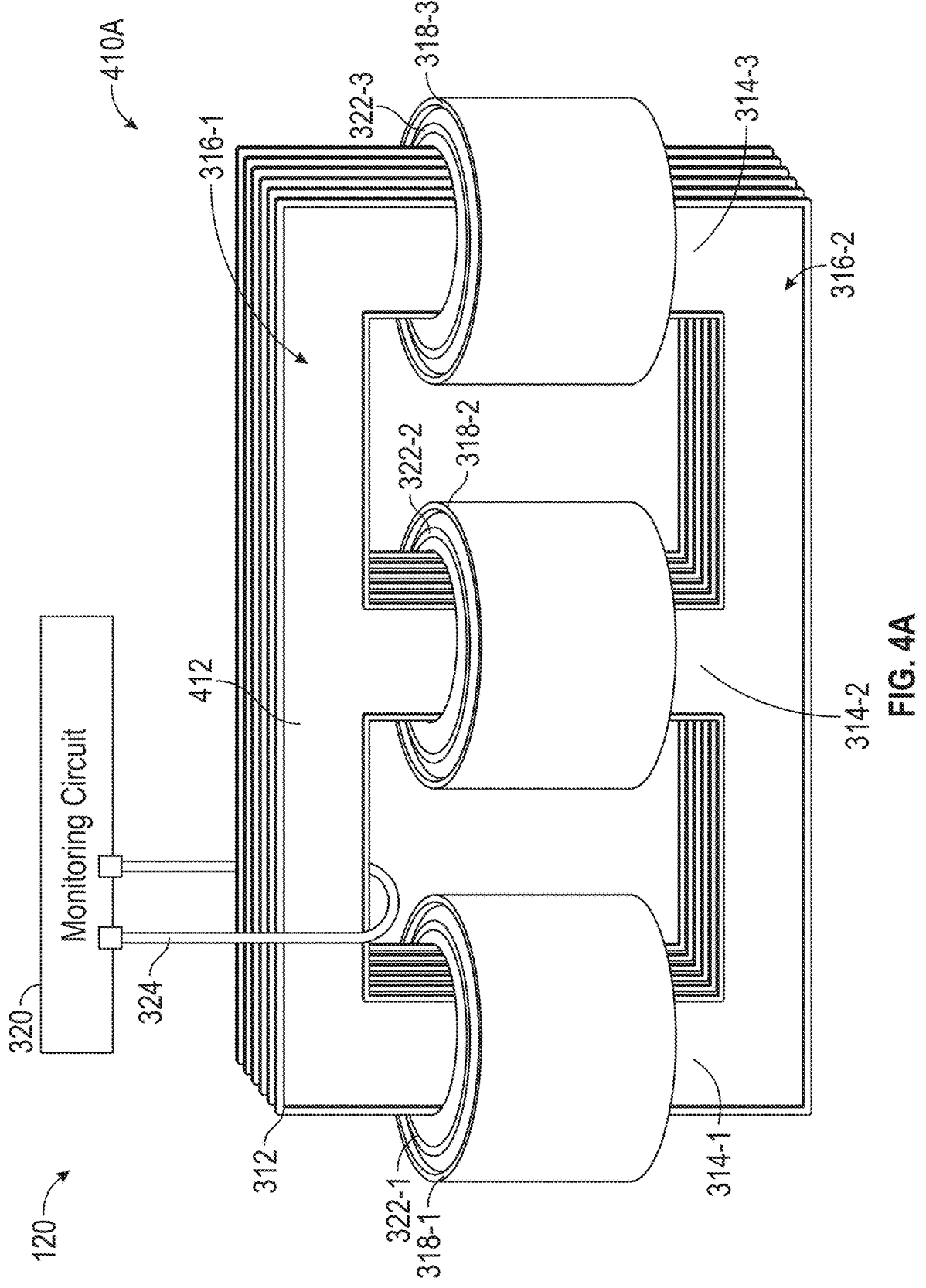
FIGS. 4A-4C depicts different examples of a substation transformer with one or more monitoring windings, according to various embodiments.
Figure 4B:
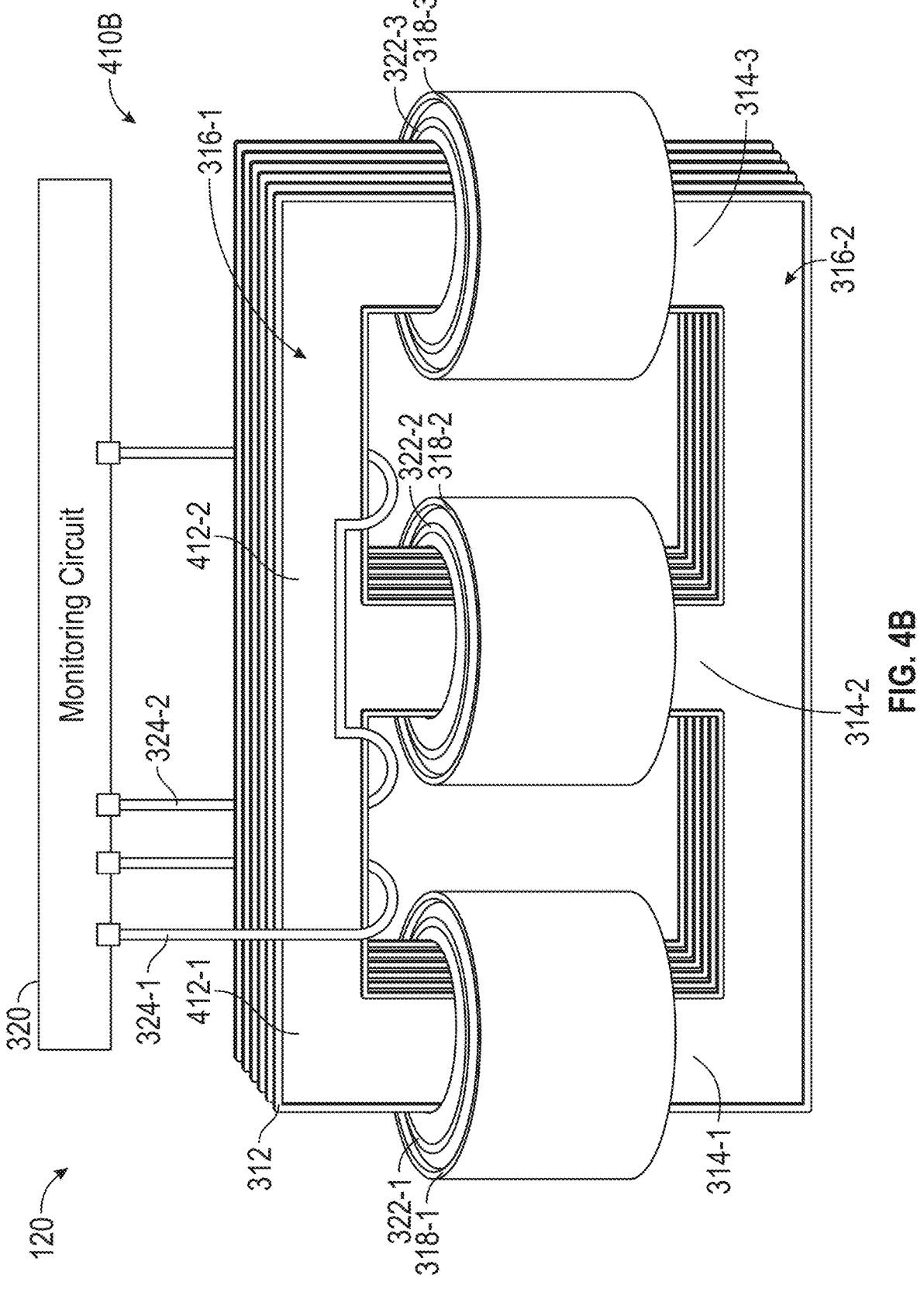
Figure 4C:
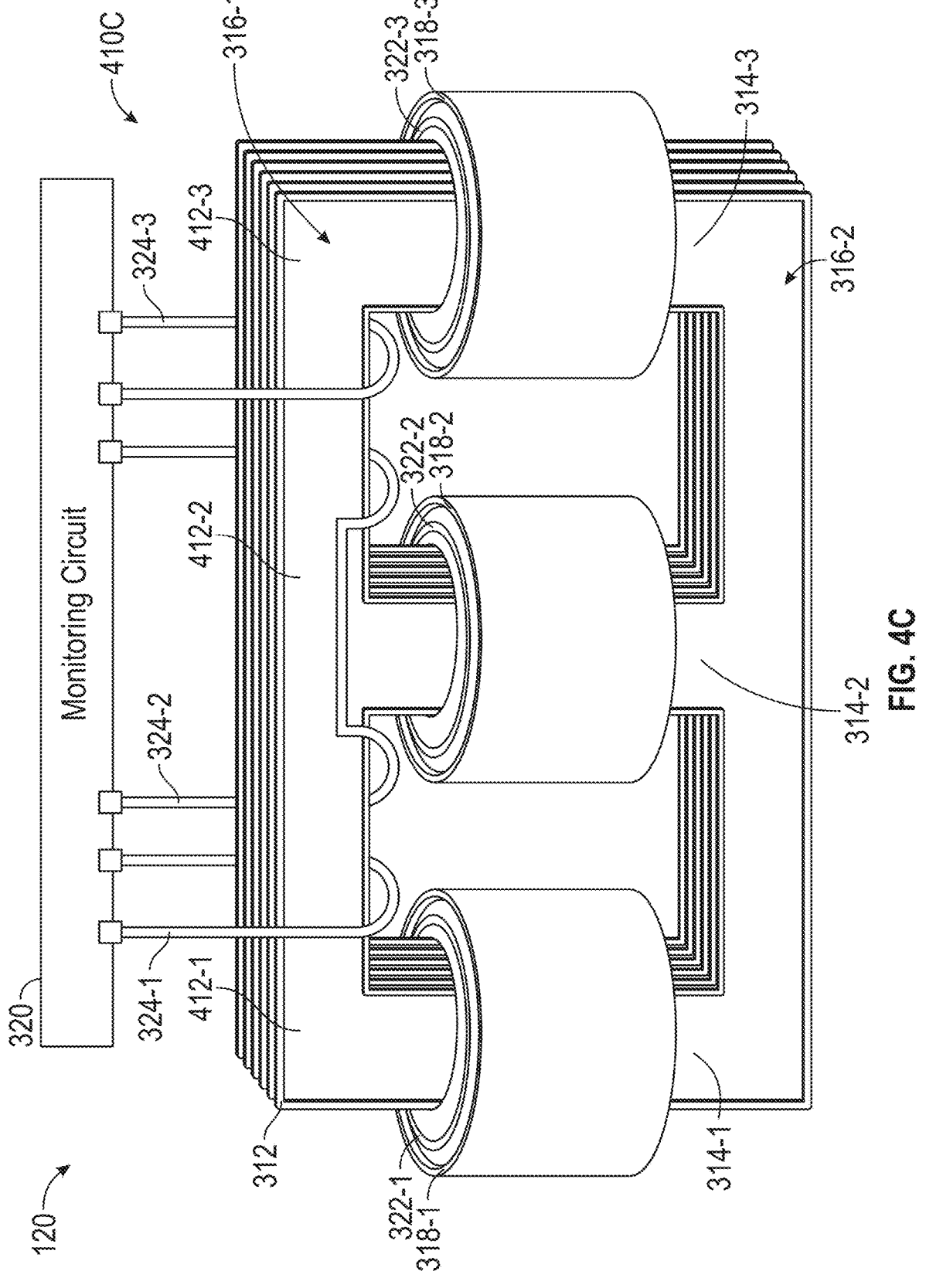

As noted, in various embodiments, the transformer 310 may include various configurations of monitoring winding(s) 324 in order to facilitate voltage measurement by the monitoring circuit 320. By way of example, FIGS. 4A-4C depict different examples of transformers 410A, 410B, and 410C, respectively, each having a different configuration of one or more monitoring windings 324, according to various embodiments. Note, the transformer 410A, 410B, and 410C are illustrative example implementations of the transformer 310 depicted in FIG. 3. For example, each transformer 410A, 410B, and 410C is a three-leg transformer having three core legs 314-1 to 314-3 and two yokes 316-1 to 316-2.

As illustrated in FIG. 4A, in certain embodiments, the transformer 410A includes a single monitoring winding 324. As shown, the single monitoring winding 324 is arranged around a yoke segment 412 of the yoke 316-1 of the core 312. Here, the yoke segment 412 is the portion of the yoke 316-1 between core leg 314-1 and core leg 314-2. The monitoring winding 324 may be used to measure a single-phase voltage of the transformer 410A, such as the single-phase voltage associated with the primary winding 318-1 and/or secondary winding 322-1. Note while FIG. 4A depicts the monitoring winding 324 being disposed in a location of the core 312 that allows the monitoring winding 324 to detect the single-phase voltage associated with the primary winding 318-1 and/or secondary winding 322-1, in certain embodiments, the monitoring winding 324 may be disposed in other locations of the core 312 in order to detect the single-phase voltage associated with the (i) primary winding 318-2 and/or secondary winding 322-2; or (ii) primary winding 318-3 and/or secondary winding 322-3.

In embodiments where the transformer 410A includes a single monitoring winding 324, the monitoring circuit 320 may measure a "first" single-phase voltage of the transformer 410A (e.g., single-phase line-line (phase A-B) voltage measurement) via the monitoring winding 324 and determine the "second" and "third" single-phase voltages of the transformer 410A, based on the measured "first" single-phase voltage. For example, as noted, assuming a symmetric supply, the magnitudes of the first, second, and third single-phase voltages may be approximately the same, and the phases of the first, second, and third single-phase voltages may be offset by 120° with respect to each other.

As illustrated in FIG. 4B, in certain embodiments, the transformer 410B may include two monitoring windings 324-1 and 324-2. As shown, the monitoring winding 324-1 is arranged around a yoke segment 412-1 of the yoke 316-1 of the core 312, and the monitoring winding 324-2 is arranged around a yoke segment 412-2 of the yoke 316-1 of the core 312. The yoke segment 412-2 is the portion of the yoke 316-1 between core leg 314-1 and core leg 314-3.

In FIG. 4B, the monitoring winding 324-1 may be used to measure a "first" single-phase voltage of the transformer 410B (e.g., single-phase voltage associated with the primary winding 318-1 and/or secondary winding 322-1), and the monitoring winding 324-2 may be used to measure a "second" single-phase voltage of the transformer 410B (e.g., single-phase voltage associated with the primary winding 318-2 and/or secondary winding 322-2).

In embodiments where the transformer 410B includes two monitoring windings 324-1 and 324-2, the monitoring circuit 320 may measure a "first" single-phase voltage of the transformer 410B via the monitoring winding 324-1, measure a "second" single-phase voltage of the transformer 410B via the monitoring winding 324-2, and determine the "third" single-phase voltage of the transformer 410B, based on at least one of the measured "first" single-phase voltage or the measured "second" single-phase voltage. For example, as noted, assuming a symmetric supply, the magnitudes of the first, second, and third single-phase voltages may be approximately the same, and the phases of the first, second, and third single-phase voltages may be offset by 120° with respect to each other.

As illustrated in FIG. 4C, in certain embodiments, the transformer 410C may include three monitoring windings 324-1, 324-2, and 324-3. As shown, the monitoring winding 324-1 is arranged around the yoke segment 412-1, the monitoring winding 324-2 is arranged around the yoke segment 412-2, and the monitoring winding 324-3 is arranged around the yoke segment 412-3 of the yoke 316-1 of the core 312. The yoke segment 412-3 is the portion of the yoke 316-1 between core leg 314-2 and core leg 314-3.

In FIG. 4C, the monitoring winding 324-1 may be used to measure a "first" single-phase voltage of the transformer 410C (e.g., single-phase voltage associated with the primary winding 318-1 and/or secondary winding 322-1), the monitoring winding 324-2 may be used to measure a "second" single-phase voltage of the transformer 410C (e.g., single-phase voltage associated with the primary winding 318-2 and/or secondary winding 322-2), and the monitoring winding 324-3 may be used to measure a "third" single-phase voltage of the transformer 410C (e.g., single-phase voltage associated with the primary winding 318-3 and/or secondary winding 322-3).

Figure 5A:
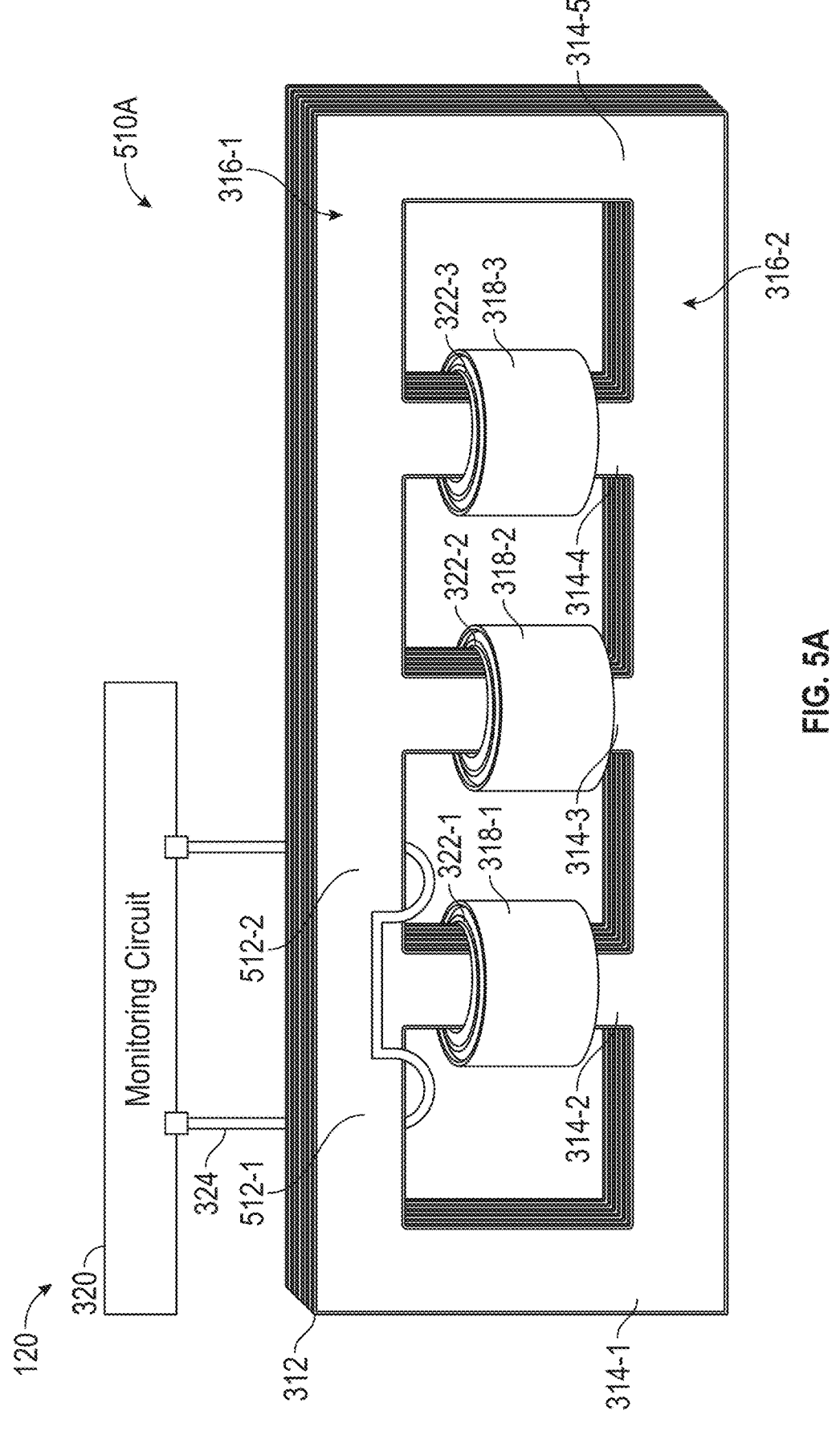
FIGS. 5A-5B depict different examples of a substation transformer with one or more monitoring windings, according to various embodiments.
Figure 5B:
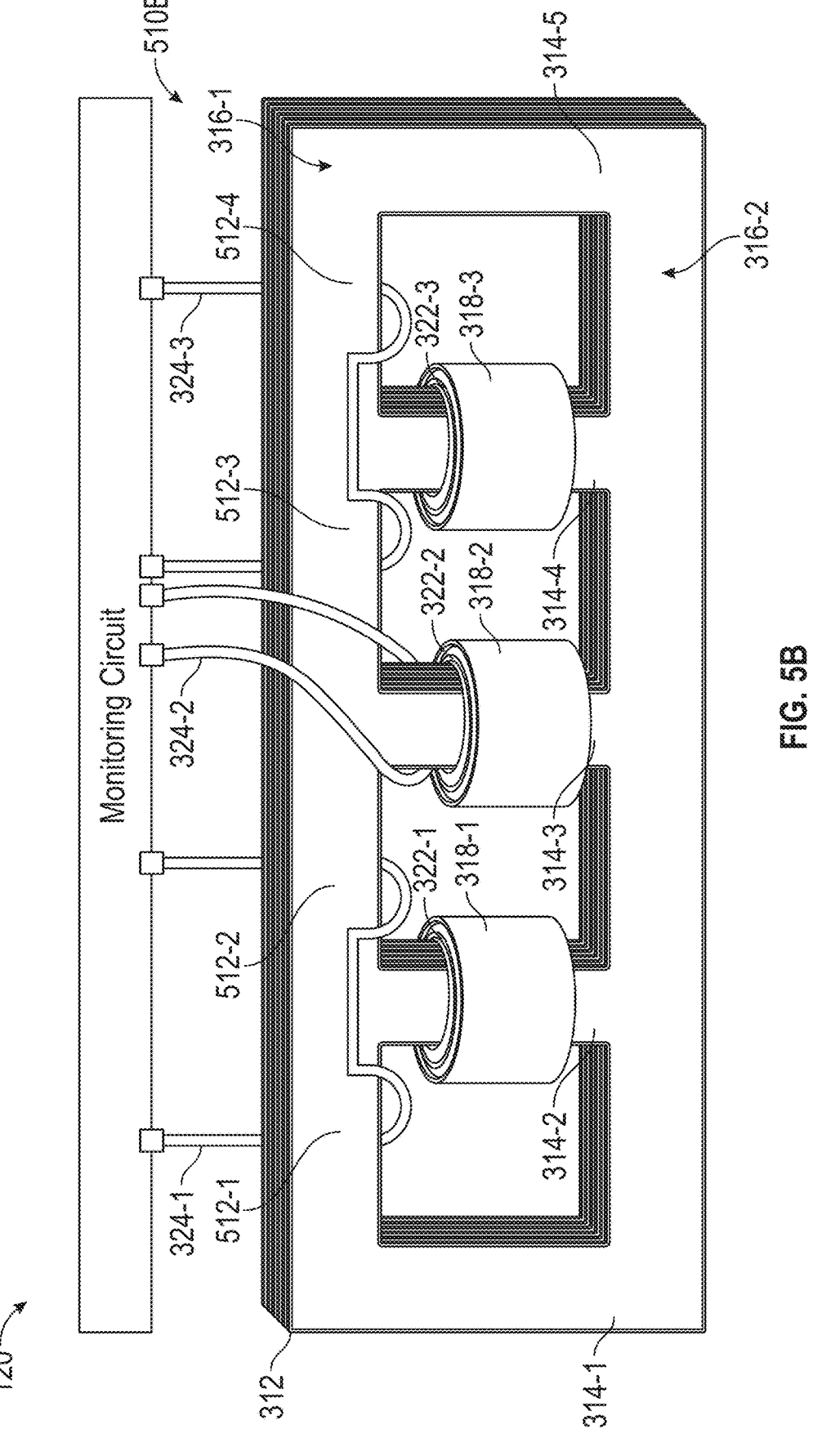

By way of another example, FIGS. 5A-5B depict different examples of transformers 510A and 510B, respectively, each having a different configuration of one or more monitoring windings 324, according to various embodiments. Note, the transformer 510A and 510B are illustrative example implementations of the transformer 310 depicted in FIG. 3. For example, each transformer 510A and 510B is a five-leg transformer having five core legs 314-1 to 314-5 and two yokes 316-1 to 316-2.

As illustrated in FIG. 5A, in certain embodiments, the transformer 510A includes a single monitoring winding 324. As shown, the single monitoring winding 324 is arranged around yoke segments 512-1 and 512-2 of the yoke 316-1 of the core 312. Here, the yoke segment 512-1 is the portion of the yoke 316-1 between core leg 314-1 and core leg 314-2, the yoke segment 512-2 is the portion of the yoke 316-1 between core leg 314-2 and core leg 314-3. The monitoring winding 324 may be used to measure a single-phase voltage of the transformer 510A, such as the single-phase voltage associated with the primary winding 318-1 and/or secondary winding 322-1. Note while FIG. 5A depicts the monitoring winding 324 being disposed in a location of the core 312 that allows the monitoring winding 324 to detect the single-phase voltage associated with the primary winding 318-1 and/or secondary winding 322-1, in certain embodiments, the monitoring winding 324 may be disposed in other locations of the core 312 in order to detect the single-phase voltage associated with the (i) primary winding 318-2 and/or secondary winding 322-2; or (ii) primary winding 318-3 and/or secondary winding 322-3.

As illustrated in FIG. 5B, in certain embodiments, the transformer 510B includes multiple monitoring windings 324-1, 324-2, and 324-3. As shown, the monitoring winding 324-1 is arranged around the yoke segment 512-1 and the yoke segment 512-2, the monitoring winding 324-2 is arranged around the core leg 314-3, and the monitoring winding 324-3 is arranged around the yoke segment 512-3 and the yoke segment 512-4 of the yoke 316-1 of the core 312. The yoke segment 512-3 is the portion of the yoke 316-1 between core leg 314-3 and core leg 314-4, and the yoke segment 512-4 is the portion of the yoke 316-1 between core leg 314-4 and core leg 314-5.

In FIG. 5B, the monitoring winding 324-1 may be used to measure a "first" single-phase voltage of the transformer 510B (e.g., single-phase voltage associated with the primary winding 318-1 and/or secondary winding 322-1), the monitoring winding 324-2 may be used to measure a "second" single-phase voltage of the transformer 510B (e.g., single-phase voltage associated with the primary winding 318-2 and/or secondary winding 322-2), and the monitoring winding 324-3 may be used to measure a "third" single-phase voltage of the transformer 510B (e.g., single-phase voltage associated with the primary winding 318-3 and/or secondary winding 322-3).

Figure 6:
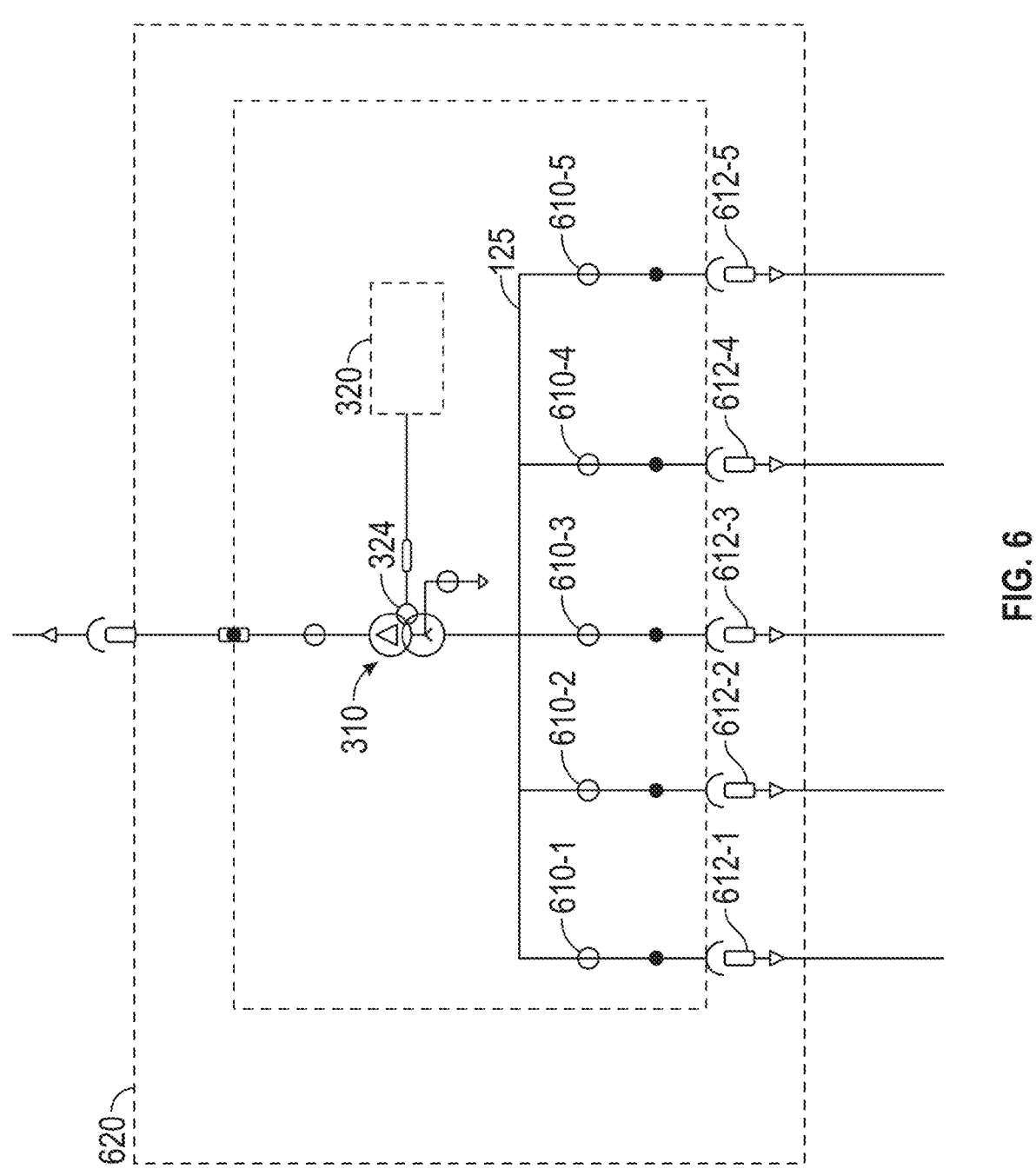
FIG. 6 is a schematic diagram of a substation, according to various embodiments.

FIG. 6 is a schematic diagram of an example substation 620, according to various embodiments. The substation 620 is an illustrative example implementation of the substation 120 illustrated in FIG. 1. In this embodiment, the substation 620 includes a single transformer 310 coupled to five generators 140 (e.g., incomers/feeders) (not shown) via connectors 612 and current transformers 610. The substation 620 also includes a single monitoring winding 324 coupled between the transformer 310 and the monitoring circuit 320.

Figure 7:
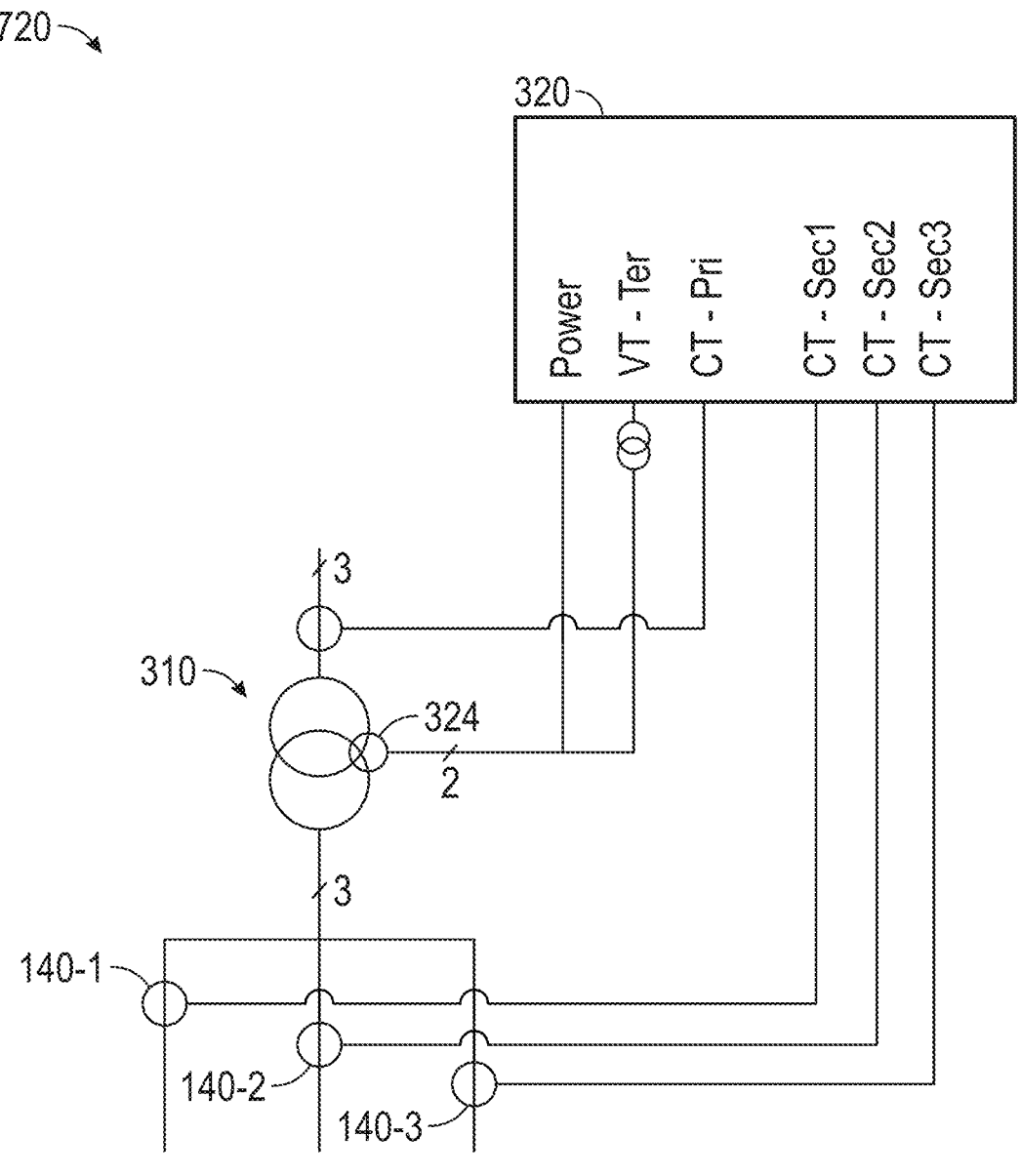
FIG. 7 is a schematic diagram of a substation, according to various embodiments.

By way of another example, FIG. 7 is a schematic diagram of another example substation 720, according to various embodiments. The substation 720 is an illustrative example implementation of the substation 120 illustrated in FIG. 1. In this embodiment, the substation 720 includes a single transformer 310 coupled to three generators 140 (e.g., incomers/feeders). The substation 720 also includes a single monitoring winding 324 coupled between the transformer 310 and the monitoring circuit 320. As shown, the monitoring winding 324 may be used to power the monitoring circuit 320 as well as facilitate voltage measurement by the monitoring circuit 320.

Example Operations

FIG. 8 is a flow diagram depicting an example operations 800 for fault monitoring in a system (e.g., system 100) including a substation (e.g., substation 120) and multiple generators (e.g., generators 140) coupled to the substation, according to various embodiments. The operations 800 may be performed, for example, by a monitoring circuit (e.g., monitoring circuit 320).

The operations 800 may involve, at block 802, measuring a single-phase voltage of a transformer of the substation via a monitoring winding (e.g., monitoring winding 324). The transformer may include a core (e.g., core 312) and the monitoring winding, and the monitoring winding may be disposed on the core.

The operations 800 may further involve, at block 804, monitoring for one or more faults within the system based at least in part on the single-phase voltage. In certain embodiments, monitoring for the one or more faults may include performing directional overcurrent protection based at least in part on the single-phase voltage. For example, the directional overcurrent protection may involve using a combination of current and voltage measurements to determine the fault direction relative to the measurement point based on the phase angles of the voltage and current.

Example Computing Device

Figure 9:
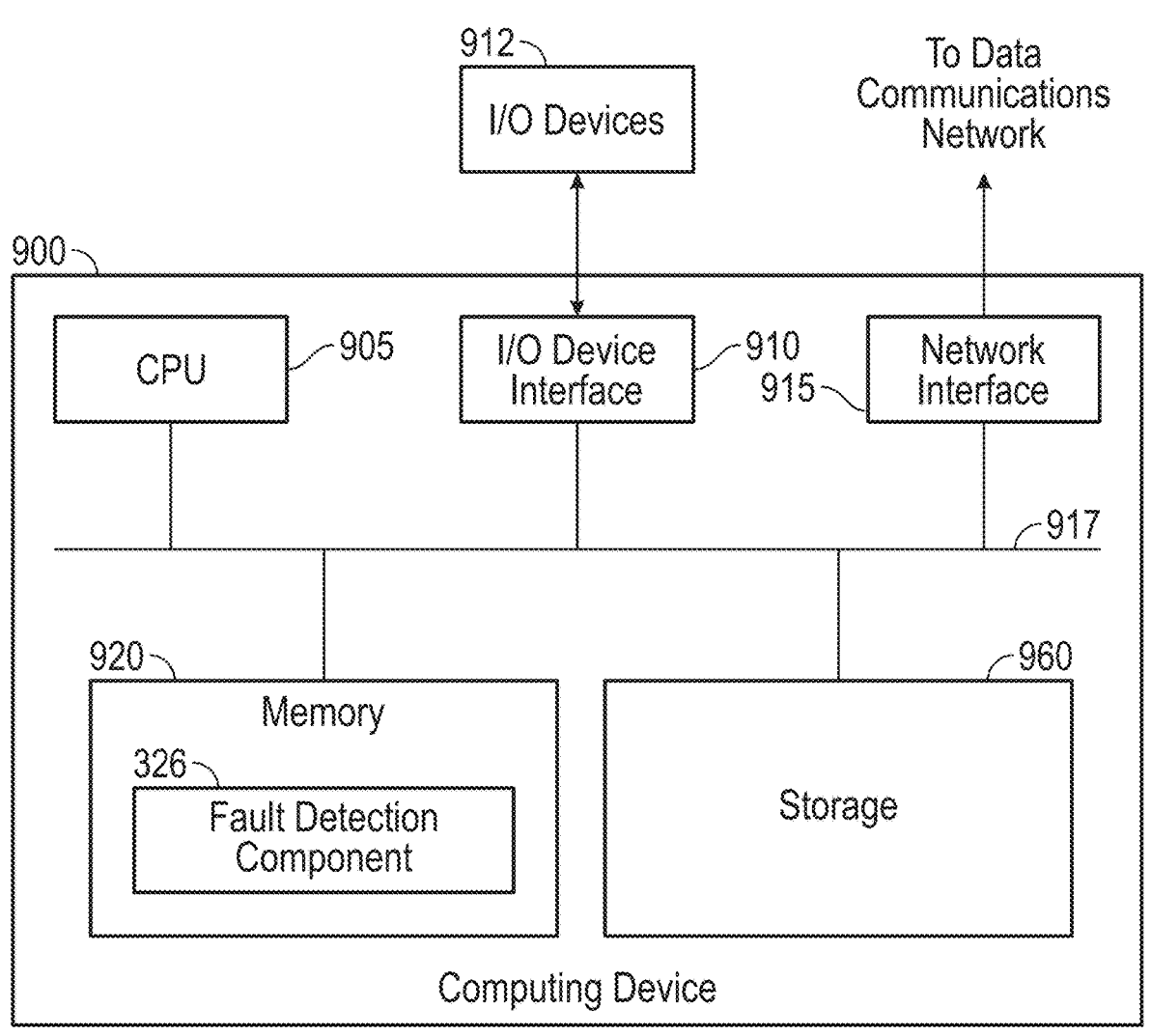
FIG. 9 depicts an example computing device, according to various embodiments.

FIG. 9 illustrates an example computing device 900 configured to perform fault monitoring for a system including a transformer coupled to multiple generators, according to various embodiments. In certain embodiments, the computing device 900 may be configured to perform operations 800 illustrated in FIG. 8 or any other technique or combination of techniques described herein.

As shown, the computing device 900 includes, without limitation, a central processing unit (CPU) 905, a network interface 915, a memory 920, and storage 960, each connected to a bus 917. The computing device 900 may also include an input/output (I/O) device interface 910 connecting I/O devices 912 (e.g., keyboard, display and mouse devices) to the computing device 900. The computing device 900 is generally under the control of an operating system (not shown).

The CPU 905 retrieves and executes programming instructions stored in the memory 920 as well as stored in the storage 960. The bus 917 is used to transmit programming instructions and application data between the CPU 905, I/O device interface 910, storage 960, network interface 915, and memory 920. Note, CPU 905 is included to be representative of a single CPU, multiple CPUs, a single CPU having multiple processing cores, and the like, and the memory 920 is generally included to be representative of a random access memory. The storage 960 may be a disk drive or flash storage device. Although shown as a single unit, the storage 960 may be a combination of fixed and/or removable storage devices, such as fixed disc drives, removable memory cards, optical storage, network attached storage (NAS), or a storage area-network (SAN).

Illustratively, the memory 920 includes the fault detection component 326, which is discussed in greater detail above. Note, while FIG. 9 depicts the fault detection component 326 within memory 920, which is generally representative of volatile memory (e.g., random access memory), in certain embodiments, the fault detection component 326 is included in persistent (e.g., non-volatile) memory or persistent (e.g., non-volatile) storage, such as storage 960 of FIG. 9.

Example Clauses

Implementation examples are described in the following numbered clauses:

Clause 1: A substation comprising: a transformer coupled to a plurality of generators and comprising: a core; and a first monitoring winding disposed on the core; and a monitoring circuit coupled to the first monitoring winding and configured to: measure a first single-phase voltage of the transformer via the first monitoring winding; and monitor for one or more faults that affect the substation based at least in part on the first single-phase voltage.

Clause 2: The substation of Clause 1, wherein: the core comprises a plurality of yoke segments and a plurality of core legs; the transformer comprises a first set of windings disposed around a first core leg of the plurality of core legs, the first set of windings being coupled to a first single-phase power supply; and the first monitoring winding is disposed around a first yoke segment of the plurality of yoke segments, the first monitoring winding being inductively coupled to the first set of windings.

Clause 3: The substation of any of Clauses 1-2, wherein: the monitoring circuit is further configured to determine a second single-phase voltage and a third single-phase voltage of the transformer, based on the first single-phase voltage; and the monitoring circuit is configured to monitor for the one or more faults further based at least in part on the second single-phase voltage and the third single-phase voltage.

Clause 4: The substation of any of Clauses 1-2, wherein: the transformer further comprises: a second set of windings disposed around a second core leg of the plurality of core legs, the second set of windings being coupled to a second single-phase power supply; and a second monitoring winding disposed around a second yoke segment of the plurality of yoke segments, the second monitoring winding being inductively coupled to the second set of windings; the monitoring circuit is further coupled to the second monitoring winding and further configured to measure a second single-phase voltage of the transformer via the second monitoring winding; and the monitoring circuit is configured to monitor for the one or more faults further based at least in part on the second single-phase voltage.

Clause 5: The substation of Clause 4, wherein: the monitoring circuit is further configured to determine a third single-phase voltage of the transformer, based on at least one of the first single-phase voltage or the second single-phase voltage; and the monitoring circuit is configured to monitor for the one or more faults further based at least in part on the third single-phase voltage.

Clause 6: The substation of any of Clauses 1-2 and 4, wherein: the transformer further comprises: a third set of windings disposed around a third core leg of the plurality of core legs, the third set of windings being coupled to a third single-phase power supply; and a third monitoring winding disposed around a third yoke segment of the plurality of yoke segments, the third monitoring winding being inductively coupled to the third set of windings; the monitoring circuit is further coupled to the third monitoring winding and further configured to measure a third single-phase voltage of the transformer via the third monitoring winding; and the monitoring circuit is configured to monitor for the one or more faults further based at least in part on the third single-phase voltage.

Clause 7: The substation of any of Clauses 1-6, wherein: the monitoring circuit further comprises a plurality of current transformers; the monitoring circuit is further configured to measure a respective single-phase current within the transformer via a respective current transformer of the plurality of current transformers; and the monitoring circuit is configured to monitor for one or more faults further based at least in part on the measured single-phase currents.

Clause 8: The substation of Clause 7, wherein to monitor for the one or more faults, the monitoring circuit is configured to: determine a phase angle of the first single-phase voltage and at least one phase angle of at least one of the measured single-phase currents; and determine a direction of the one or more faults, based on a comparison of the phase angle of the first single-phase voltage and the at least one phase angle of the at least one of the measured single-phase currents.

Clause 9: The substation of any of Clauses 1-8, wherein: the core comprises a plurality of yoke segments; and the first monitoring winding is disposed around a single yoke segment of the plurality of yoke segments.

Clause 10: The substation of any of Clauses 1-8, wherein: the core comprises a plurality of yoke segments; and the first monitoring winding is disposed around each of at least two yoke segments of the plurality of yoke segments.

Clause 11: The substation of any of Clauses 1-8, wherein: the core comprises a plurality of core legs; and the first monitoring winding is disposed around a single core leg of the plurality of core legs.

Clause 12: The substation of any of Clauses 1-11, wherein the core is a 3-leg core or a 5-leg core.

Clause 13: The substation of any of Clauses 1-12, wherein the first monitoring winding provides a power supply for the monitoring circuit.

Clause 14: A system comprising: a plurality of generators; and a substation coupled to the plurality of generators and comprising: a transformer comprising: a core; and a first monitoring winding disposed on the core; and a monitoring circuit coupled to the first monitoring winding and configured to: measure a first single-phase voltage of the transformer via the first monitoring winding; and monitor for one or more faults within the system based at least in part on the first single-phase voltage.

Clause 15: The system of Clause 14, wherein: the core comprises a plurality of yoke segments and a plurality of core legs; the transformer comprises a first set of windings disposed around a first core leg of the plurality of core legs, the first set of windings being coupled to a first single-phase power supply; and the first monitoring winding is disposed around a first yoke segment of the plurality of yoke segments, the first monitoring winding being inductively coupled to the first set of windings.

Clause 16: The system of any of Clauses 14-15, wherein: the transformer further comprises: a second set of windings disposed around a second core leg of the plurality of core legs, the second set of windings being coupled to a second single-phase power supply; and a second monitoring winding disposed around a second yoke segment of the plurality of yoke segments, the second monitoring winding being inductively coupled to the second set of windings; the monitoring circuit is further coupled to the second monitoring winding and further configured to measure a second single-phase voltage of the transformer via the second monitoring winding; and the monitoring circuit is configured to monitor for the one or more faults within the system further based at least in part on the second single-phase voltage.

Clause 17: The system of any of Clauses 14-16, wherein: the transformer further comprises: a third set of windings disposed around a third core leg of the plurality of core legs, the third set of windings being coupled to a third single-phase power supply; and a third monitoring winding disposed around a third yoke segment of the plurality of yoke segments, the third monitoring winding being inductively coupled to the third set of windings; the monitoring circuit is further coupled to the third monitoring winding and further configured to measure a third single-phase voltage of the transformer via the third monitoring winding; and the monitoring circuit is configured to monitor for the one or more faults within the system further based at least in part on the third single-phase voltage.

Clause 18: The system of any of Clauses 14-17, wherein: the monitoring circuit further comprises a plurality of current transformers; the monitoring circuit is further configured to measure a respective single-phase current within the transformer via a respective current transformer of the plurality of current transformers; and the monitoring circuit is configured to monitor for one or more faults within the system further based at least in part on the measured single-phase currents.

Clause 19: The system of Clause 18, wherein to monitor for the one or more faults, the monitoring circuit is configured to: determine a phase angle of the first single-phase voltage and at least one phase angle of at least one of the measured single-phase currents; and determine a direction of the one or more faults, based on a comparison of the phase angle of the first single-phase voltage and the at least one phase angle of the at least one of the measured single-phase currents.

Clause 20: The system of any of Clauses 14-19, further comprising a respective circuit breaker coupled between the substation and a respective generator of the plurality of generators, wherein the monitoring circuit is further configured to: determine that one of the plurality of generators is a source of the one or more faults, based on the monitoring; and trigger an automatic disconnection of the generator that is the source of the one or more faults from the system via the respective circuit breaker coupled to the generator that is the source of the one or more faults.

Clause 21: The system of any of Clauses 14-20, wherein: the substation and the plurality of generators are located on-shore; the substation and the plurality of generators are located off-shore; the substation is located on-shore and the plurality of generators are located off-shore; or the substation is located off-shore and the plurality of generators are located on-shore.

Clause 22: A method for fault monitoring in a system comprising a substation and a plurality of generators coupled to the substation, the method comprising: measuring a single-phase voltage of a transformer of the substation via a monitoring winding, wherein the transformer comprises a core and the monitoring winding and wherein the monitoring winding is disposed on the core; and monitoring for one or more faults within the system based at least in part on the single-phase voltage.

Additional Considerations

The preceding description is provided to enable any person skilled in the art to practice the various aspects described herein. The examples discussed herein are not limiting of the scope, applicability, or aspects set forth in the claims. Various modifications to these aspects will be readily apparent to those skilled in the art, and the general principles defined herein may be applied to other aspects. For example, changes may be made in the function and arrangement of elements discussed without departing from the scope of the disclosure. Various examples may omit, substitute, or add various procedures or components as appropriate. For instance, the methods described may be performed in an order different from that described, and various actions may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, a system on a chip (SoC), or any other such configuration.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, "a processor," "at least one processor," or "one or more processors" generally refer to a single processor configured to perform one or multiple operations or multiple processors configured to collectively perform one or more operations. In the case of multiple processors, performance of the one or more operations could be divided amongst different processors, though one processor may perform multiple operations, and multiple processors could collectively perform a single operation. Similarly, "a memory," "at least one memory," or "one or more memories" generally refer to a single memory configured to store data and/or instructions or multiple memories configured to collectively store data and/or instructions.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more actions for achieving the methods. The method actions may be interchanged with one another without departing from the scope of the claims. In other words, unless a specific order of actions is specified, the order and/or use of specific actions may be modified without departing from the scope of the claims. Further, the various operations of methods described above may be performed by any suitable means capable of performing the corresponding functions. The means may include various hardware and/or software component(s) and/or module(s), including, but not limited to a circuit, an ASIC, or processor.

The following claims are not intended to be limited to the aspects shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112 (f) unless the element is expressly recited using the phrase "means for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

The invention claimed is:

1. A substation comprising:
a transformer coupled to a plurality of generators and comprising:
  a core comprising a plurality of yoke segments and a plurality of core legs;
  a first set of windings disposed around a first core leg of the plurality of core legs, the first set of windings being coupled to a first single-phase power supply; and
  a first monitoring winding disposed on the core and around a first yoke segment of the plurality of yoke segments, the first monitoring winding being inductively coupled to the first set of windings; and
a monitoring circuit coupled to the first monitoring winding and configured to:
  measure a first single-phase voltage of the transformer via the first monitoring winding; and
  monitor for one or more faults that affect the substation based at least in part on the first single-phase voltage.

2. The substation of claim 1, wherein:
the monitoring circuit is further configured to determine a second single-phase voltage and a third single-phase voltage of the transformer, based on the first single-phase voltage; and the monitoring circuit is configured to monitor for the one or more faults further based at least in part on the second single-phase voltage and the third single-phase voltage.

3. The substation of claim 1, wherein:
the transformer further comprises:
  a second set of windings disposed around a second core leg of the plurality of core legs, the second set of windings being coupled to a second single-phase power supply; and
  a second monitoring winding disposed around a second yoke segment of the plurality of yoke segments, the second monitoring winding being inductively coupled to the second set of windings;
the monitoring circuit is further coupled to the second monitoring winding and further configured to measure a second single-phase voltage of the transformer via the second monitoring winding; and
the monitoring circuit is configured to monitor for the one or more faults further based at least in part on the second single-phase voltage.

4. The substation of claim 3, wherein:
the monitoring circuit is further configured to determine a third single-phase voltage of the transformer, based on at least one of the first single-phase voltage or the second single-phase voltage; and
the monitoring circuit is configured to monitor for the one or more faults further based at least in part on the third single-phase voltage.

5. The substation of claim 3, wherein:
the transformer further comprises:
  a third set of windings disposed around a third core leg of the plurality of core legs, the third set of windings being coupled to a third single-phase power supply; and
  a third monitoring winding disposed around a third yoke segment of the plurality of yoke segments, the third monitoring winding being inductively coupled to the third set of windings;
the monitoring circuit is further coupled to the third monitoring winding and further configured to measure a third single-phase voltage of the transformer via the third monitoring winding; and
the monitoring circuit is configured to monitor for the one or more faults further based at least in part on the third single-phase voltage.

6. The substation of claim 1, wherein:
the monitoring circuit further comprises a plurality of current transformers;
the monitoring circuit is further configured to measure a respective single-phase current within the transformer via a respective current transformer of the plurality of current transformers; and
the monitoring circuit is configured to monitor for the one or more faults further based at least in part on the measured single-phase currents.

7. The substation of claim 6, wherein to monitor for the one or more faults, the monitoring circuit is configured to:
determine a phase angle of the first single-phase voltage and at least one phase angle of at least one of the measured single-phase currents; and
determine a direction of the one or more faults, based on a comparison of the phase angle of the first single-phase voltage and the at least one phase angle of the at least one of the measured single-phase currents.

8. The substation of claim 1, wherein the first monitoring winding provides a power supply for the monitoring circuit.

9. A system comprising:

a plurality of generators; and a substation coupled to the plurality of generators and comprising:

a transformer comprising:

a core; and a first monitoring winding disposed on the core; and a monitoring circuit coupled to the first monitoring winding and comprising a plurality of current transformers, the monitoring circuit configured to:

measure a first single-phase voltage of the transformer via the first monitoring winding;

measure a respective single-phase current within the transformer via a respective current transformer of the plurality of current transformers; and monitor for one or more faults within the system based at least in part on the first single-phase voltage and the measured single-phase currents.

10. The system of claim 9, wherein:

the core comprises a plurality of yoke segments and a plurality of core legs;

the transformer comprises a first set of windings disposed around a first core leg of the plurality of core legs, the first set of windings being coupled to a first single-phase power supply; and the first monitoring winding is disposed around a first yoke segment of the plurality of yoke segments, the first monitoring winding being inductively coupled to the first set of windings.

11. The system of claim 10, wherein:

the transformer further comprises:

a second set of windings disposed around a second core leg of the plurality of core legs, the second set of windings being coupled to a second single-phase power supply; and a second monitoring winding disposed around a second yoke segment of the plurality of yoke segments, the second monitoring winding being inductively coupled to the second set of windings;

the monitoring circuit is further coupled to the second monitoring winding and further configured to measure a second single-phase voltage of the transformer via the second monitoring winding; and the monitoring circuit is configured to monitor for the one or more faults within the system further based at least in part on the second single-phase voltage.

12. The system of claim 5, wherein to monitor for the one or more faults, the monitoring circuit is configured to:

determine a phase angle of the first single-phase voltage and at least one phase angle of at least one of the measured single-phase currents; and determine a direction of the one or more faults, based on a comparison of the phase angle of the first single-phase voltage and the at least one phase angle of the at least one of the measured single-phase currents.

13. The system of claim 9, further comprising a respective circuit breaker coupled between the substation and a respective generator of the plurality of generators, wherein the monitoring circuit is further configured to:

determine that one of the plurality of generators is a source of the one or more faults, based on the monitoring; and trigger an automatic disconnection of the generator that is the source of the one or more faults from the system via the respective circuit breaker coupled to the generator that is the source of the one or more faults.

14. The system of claim 9, wherein:

the substation and the plurality of generators are located on-shore;

the substation and the plurality of generators are located off-shore;

the substation is located on-shore and the plurality of generators are located off-shore; or the substation is located off-shore and the plurality of generators are located on-shore.

15. A substation comprising:

a transformer coupled to a plurality of generators and comprising:

a core comprising a plurality of core legs; and a first monitoring winding disposed on the core and around a single core leg of the plurality of core legs; and a monitoring circuit coupled to the first monitoring winding and configured to:

measure a first single-phase voltage of the transformer via the first monitoring winding; and monitor for one or more faults that affect the substation based at least in part on the first single-phase voltage.

16. The substation of claim 15, wherein:

the monitoring circuit further comprises a plurality of current transformers;

the monitoring circuit is further configured to measure a respective single-phase current within the transformer via a respective current transformer of the plurality of current transformers; and the monitoring circuit is configured to monitor for the one or more faults further based at least in part on the measured single-phase currents.

17. The substation of claim 16, wherein to monitor for the one or more faults, the monitoring circuit is configured to:

determine a phase angle of the first single-phase voltage and at least one phase angle of at least one of the measured single-phase currents; and determine a direction of the one or more faults, based on a comparison of the phase angle of the first single-phase voltage and the at least one phase angle of the at least one of the measured single-phase currents.

18. The substation of claim 15, wherein the first monitoring winding provides a power supply for the monitoring circuit.

* * * * *